(12) United States Patent
Thompson

(10) Patent No.: US 11,125,923 B1
(45) Date of Patent: Sep. 21, 2021

(54) LIQUID PHOTOCHROMIC FILTER

(71) Applicant: WELD CAMERA, LLC, Saugus, CA (US)

(72) Inventor: Gary James Thompson, Saugus, CA (US)

(73) Assignee: WELD CAMERA, LLC, Saugus, CA (US)

(*) Notice: Subject to any disclaimer, the term of this patent is extended or adjusted under 35 U.S.C. 154(b) by 796 days.

(21) Appl. No.: 15/795,241

(22) Filed: Oct. 26, 2017

Related U.S. Application Data

(60) Provisional application No. 62/496,701, filed on Oct. 27, 2016.

(51) Int. Cl.
| | | |
|---|---|---|
| *G02F 1/07* | (2006.01) | |
| *G02B 5/23* | (2006.01) | |
| *B23K 3/047* | (2006.01) | |
| *H01L 27/146* | (2006.01) | |
| *H04N 5/225* | (2006.01) | |

(52) U.S. Cl.
CPC ............... *G02B 5/23* (2013.01); *B23K 3/047* (2013.01); *H01L 27/14625* (2013.01); *H04N 5/2254* (2013.01)

(58) Field of Classification Search
CPC ... G02B 5/23; H01L 27/14625; H04N 5/2254
USPC .................................................... 359/241
See application file for complete search history.

(56) References Cited

U.S. PATENT DOCUMENTS

| | | | | |
|---|---|---|---|---|
| 3,269,267 | A * | 8/1966 | Collins | A61N 5/06 351/44 |
| 5,255,088 | A | 10/1993 | Thompson | |
| 5,475,198 | A | 12/1995 | Burke et al. | |
| 2007/0139792 | A1* | 6/2007 | Sayag | G02B 27/58 359/739 |
| 2013/0250392 | A1* | 9/2013 | Lam | B32B 17/10486 359/244 |

* cited by examiner

*Primary Examiner* — William Choi
(74) *Attorney, Agent, or Firm* — Loza & Loza, LLP; Stephen D. Burbach

(57) ABSTRACT

A liquid photochromic filter for attenuating an image is disclosed. The liquid photochromic filter includes a photochromic dye in a liquid solution that is contained in a cavity defined by a housing with two optical windows. The liquid photochromic filter may be used in imaging system for sensing light in an area of high optical contrast. In some implementations, the imaging system is for monitoring a welding operation, whereby the liquid photochromic filter is used to reduce the intensity of the light observed from the welding arc.

20 Claims, 13 Drawing Sheets

LIQUID PHOTOCHROMIC FILTER

CLAIM OF PRIORITY

This application claims the benefit of and priority to provisional patent application No. 62/496,701 filed in the U.S. Patent and Trademark Office on Oct. 27, 2016, the disclosure of which is hereby incorporated by reference herein.

BACKGROUND

Field

This application relates generally to imaging systems and, more specifically but not exclusively, to a liquid photochromic filter and associated applications.

INTRODUCTION

Imaging systems can be used for remote monitoring of areas of high optical contrast. For example, U.S. Pat. No. 5,255,088 describes a system for monitoring a welding operation. Such a monitoring system may be used where it is impossible or impractical for a human operator to have direct, hands-on access to the workpiece such as when a weld must be produced in the inner diameter of a pipe or within a radioactive environment.

The monitoring system of U.S. Pat. No. 5,255,088 uses a photochromic filter to reduce the intensity of the light observed from a welding arc. Ultraviolet light from the welding arc activates the photochromic filter such that the photochromic filter filters incoming light, thereby reducing the dramatic contrasts in the light from the welding area as detected by the monitoring system.

A photochromic filter may be made of solid photochromics. For example, silver halides may be placed in a homogenous glass matrix to form a filter with a thicknesses of 1 mm to 5 mm (e.g., Photogray Lenses). The mass and thickness of the material may aid in dissipating absorbed energy.

A photochromic filter may be made of an organic photochromic dye deposited on a plastic substrate (e.g., Transitions Lenses). The organic photochromic dye has improved darkening characteristics as compared to silver halides. In this case, however, all of the energy is absorbed on the surface of the plastic. Consequently, it is more difficult to dissipate the energy in this case, which can result in damage to the photochromic material.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

The disclosure relates in some aspects to a liquid photochromic filter for attenuating an image. The liquid photochromic filter includes a photochromic dye in a liquid solution that is contained in a cavity defined by a housing and two optical windows. The liquid photochromic filter may be used in an imaging system for sensing light in an area of high optical contrast. For example, the imaging system may be used for monitoring a welding operation where the liquid photochromic filter reduces the intensity of the light observed from the welding arc.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

These and other aspects of the disclosure will be more fully understood when considered with respect to the following detailed description, the appended claims, and the accompanying drawings, wherein:

Figure 1:
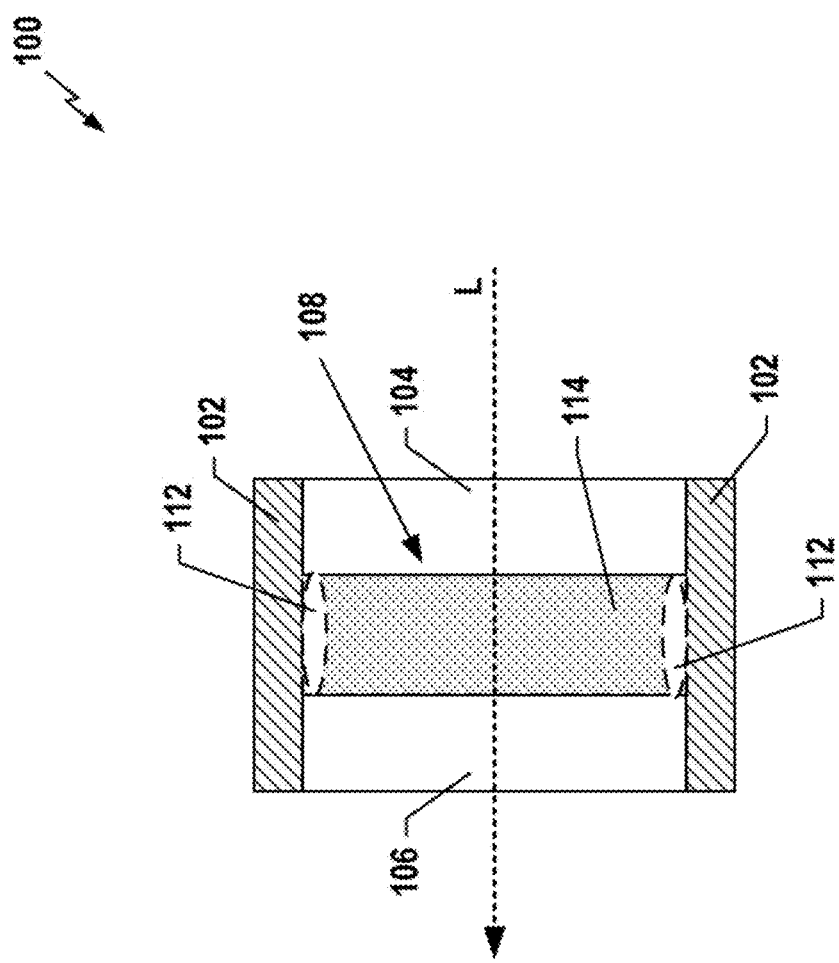
FIG. 1 depicts a simplified side view of a liquid photochromic filter in accordance with the teachings herein.

In accordance with common practice, the various features illustrated in the drawings are generally not drawn to scale. Accordingly, the dimensions of the various features may be arbitrarily expanded or reduced for clarity. In addition, some of the drawings may be simplified for clarity. Thus, the drawings typically do not depict all of the components of a given apparatus or method. Finally, like reference numerals may be used to denote like features throughout the specification and figures.

DETAILED DESCRIPTION

The description that follows sets forth one or more illustrative embodiments. It will be apparent that the teachings herein may be embodied in a wide variety of forms, some of which may appear to be quite different from those of the disclosed embodiments. Consequently, the specific structural and functional details disclosed herein are merely representative and do not limit the scope of the disclosure. For example, based on the teachings herein one skilled in the art should appreciate that the various structural and functional details disclosed herein may be incorporated in an embodiment independently of any other structural or functional details. Thus, an apparatus may be implemented or a method practiced using any number of the structural or functional details set forth in any disclosed embodiment(s). Also, an apparatus may be implemented or a method practiced using other structural or functional details in addition to or other than the structural or functional details set forth in any disclosed embodiment(s).

The disclosure relates in some aspects to a liquid photochromic filter that can be used to selectively attenuate at least a portion of an image. The liquid photochromic filter includes a photochromic dye in a liquid solution that is contained in a cavity defined by a housing with two optical windows. For example, a solid photochromic dye may be mixed with a solvent to yield a photochromic solution. As used herein, the term solvent refers to any liquid that causes the solid photochromic dye to suspend in solution.

The photochromic solution activates and darkens when exposed to electromagnetic wavelengths in the ultraviolet to violet spectrums. The thickness of the cavity and the ratio of photochromic dye to liquid solvent can be adjusted to produce the desired attenuation of the light passing through the liquid photochromic filter when the liquid photochromic filter is exposed to photochromic activating wavelengths.

The photochromic solution may be contained within an optical cavity formed between two optical windows that capture a solvent-resistant O-ring. The cavity for the photochromic solution could also be formed between a window of an image sensor and an optical window. In addition, a cavity could be formed by using a solvent resistant adhesive to adhere the optical windows to a housing (e.g., a metallic or plastic housing).

Advantageously, the liquid photochromic filter may provide a relatively high dynamic range (e.g., greater than 100 dB) around the area of attenuation. Moreover, since the liquid photochromic filter incorporates a liquid attenuation medium, the liquid photochromic filter may provide better attenuation characteristics, may provide better heat dissipation, and may have a longer working life than non-liquid photochromic filters. For example, in conventional arc welding the same area of the filter is always subjected to the high intensity light. In contrast, in a liquid photochromic filter, the photochromic components of the solution move (and any heat convects) within the solution over time. Therefore, different photochromic components of the solution are subjected to the high intensity light (and heat) over time, thereby increasing the working life of the filter.

By placing the photochromic dye in a solution, the liquid photochromic filter can have the darkening characteristics of an organic photochromic dye, the thickness of a silver halide filter, and improved energy dissipating characteristics. The liquid photochromic filter can be constructed to have an improved darkening characteristic due to the thickness of the cavity. Moreover, increasing the thickness of the cavity (and, hence, the liquid) aids in dissipating energy.

Furthermore, the liquid photochromic filter may be constructed in a manner that allows the photochromic solution to be easily replaced. Thus, if the photochromic solution degenerates over time (e.g., due to extensive exposure to high intensity light), one can simply replace the photochromic solution rather than replacing the liquid photochromic filter in its entirely. For example, a housing of the liquid photochromic filter may come apart to enable access to a chamber that holds the photochromic solution.

In an example implementation, a liquid photochromic filter may be used in an imaging system for sensing light in an area of interest. Typically, the area of interest is an area of optical contrast (e.g., relatively high optical contrast). The imaging system uses the liquid photochromic filter to reduce the intensity (e.g., brightness) of the light from the area of interest.

In some implementations, the imaging system is used to monitor a welding operation. An electric arc welding process may produce a high emission of activating wavelengths in the arc itself. When the arc is imaged and focused on the liquid photochromic filter, a light attenuating mask or negative image is produced. The area around the arc has less or no attenuation allowing the peripheral area to be viewed.

The liquid photochromic filter thus functions as a variable density optical filter for viewing the area around a welding arc, where the opacity of the liquid photochromic filter may be varied as a function of the intensity of the light from the welding arc and/or a light source. For example, the imaging system may be used with or incorporating into an arc welding environment to improve the monitoring of a welding process by dynamically filtering an image of a high intensity gradient area produced by a system of lenses and projected onto an image sensor.

The closer the photochromic solution is to the optical focal plane, the sharper the attenuation mask. A relay system can be employed to produce a remote image in the liquid photochromic filter and transmit the image to an image sensor.

Attenuation of the liquid photochromic filter may be activated, for example, by the light from the welding arc and/or by light from a light source. In the latter case, the imaging system includes a light source whereby activating light (e.g., light in the range from ultraviolet light to short wavelength blue light) from the light source activates at least a portion of the liquid photochromic filter. Thus, the opacity of the liquid photochromic filter may depend in some aspects on the intensity of the light from the light source in this case.

FIG. 1 illustrates, in a simplified manner, a liquid photochromic filter 100 including a housing 102, a first member 104, and a second member 106. In some aspects, the first member 104 and the second member 106 are transparent (i.e., they allow at least some light to pass through). For example, the first member 104 and the second member 106 may be optical windows made of transparent glass, transparent plastic, or some other suitable transparent material.

The housing 102 defines an inner cavity 108 within which the first member 104 and the second member 106 may at least partially lie. A photochromic solution 114 is placed within the cavity 108 between the first member 104 and the second member 106. Thus, light L passing through the filter 100 may be attenuated, at least in part, by the photochromic solution 114.

In some implementations, the filter 100 includes a seal 112 between the first member 104 and the second member 106. In this case, the seal 112 further defines a chamber for the photochromic solution 114 in that the photochromic solution 114 is disposed between (e.g., sealed in place by) the first member 104, the second member 106, and the seal 112.

Figure 2:
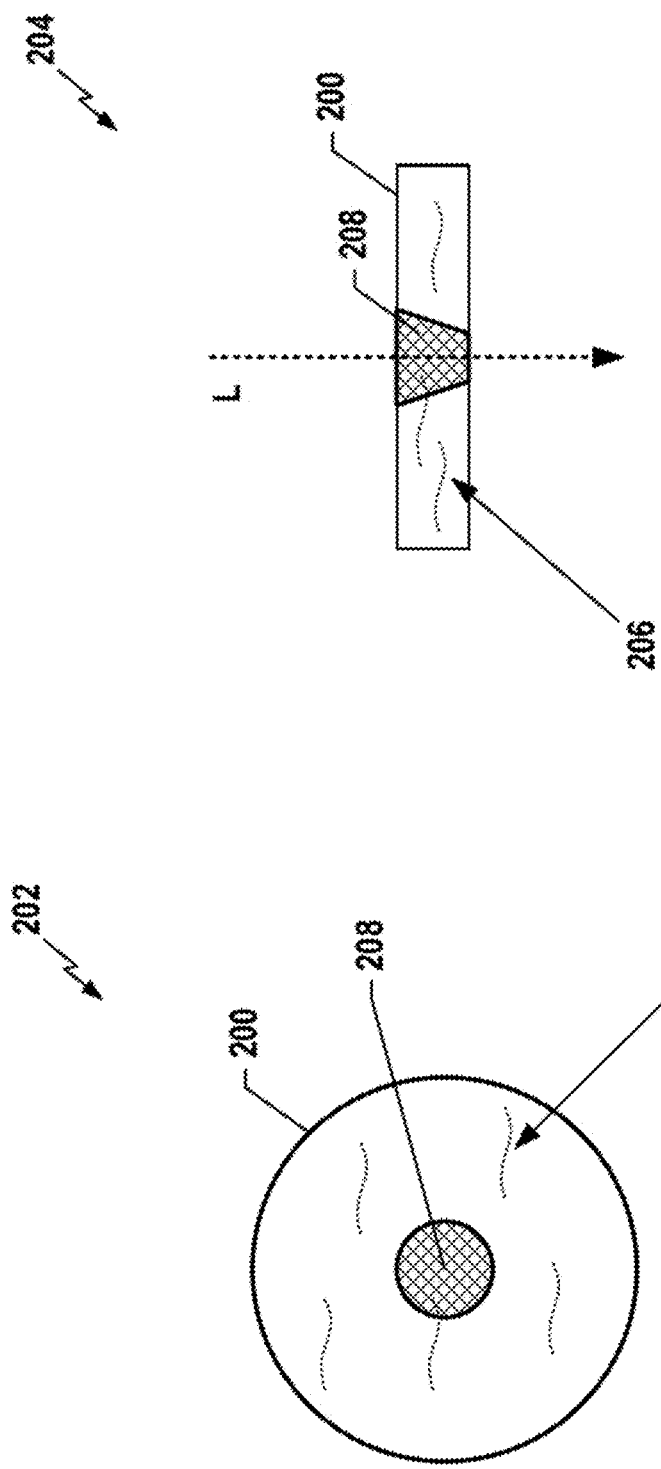
FIG. 2 depicts simplified plan and side views showing an example attenuation region of a liquid photochromic filter in accordance with the teachings herein.

FIG. 2 illustrates, in a simplified manner, attenuated areas of a liquid photochromic filter 200. A plan view 202 of the filter 200 and a side view 204 of the filter 200 are shown.

The filter 200 includes a photochromic solution 206 disposed therein (e.g., sealed in an inner chamber of the filter 200). When activating light L (e.g., from a welding arc or a light source) impinges on an area 208 of the filter 200, the photochromic solution 206 in the area 208 will be activated. Consequently, any light passing through the activated area 208 will be attenuated.

For example, light from an area of interest (e.g., light from an arc) may be attenuated while other light (e.g., light from the areas surrounding the arc) will not be attenuated or will be attenuated to a lesser degree as the light passes through the filter 200. Consequently, the filter 200 may be used to block areas of high intensity light to enable viewing in areas near the high intensity light.

Figure 3:
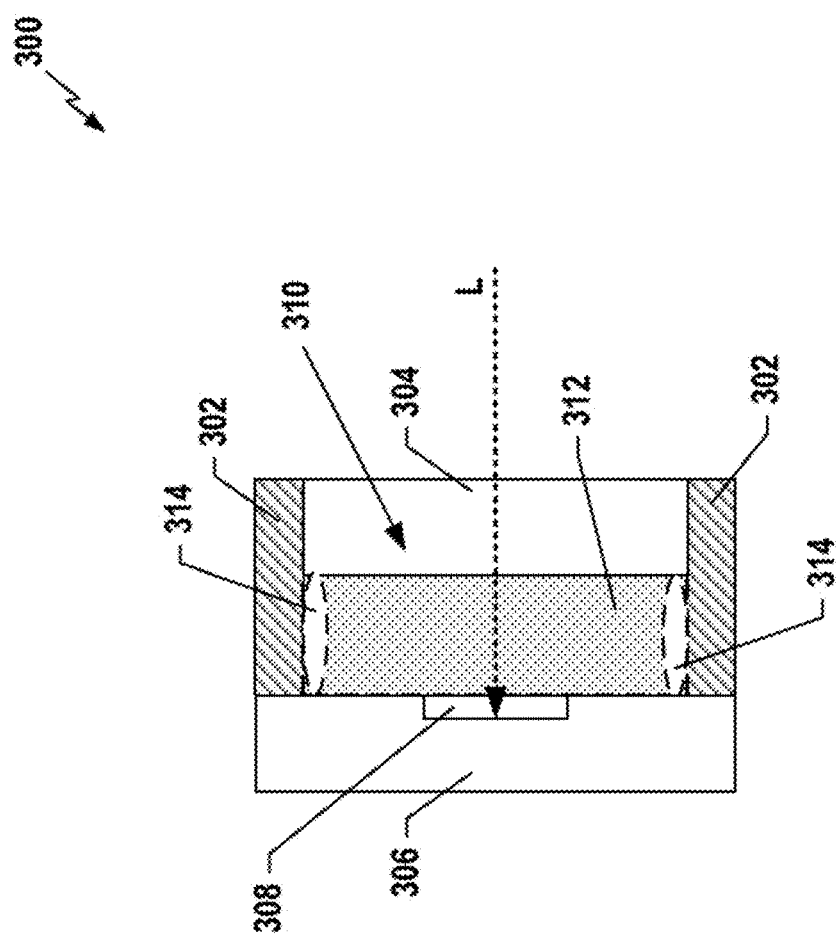
FIG. 3 depicts is a simplified side-view of a sensor assembly including a liquid photochromic filter in accordance with the teachings herein.

FIG. 3 illustrates, in a simplified manner, an example of a sensor assembly 300 including a housing 302, a first member 304, and a sensor structure 306. In some aspects, the first member 304 is transparent (e.g., the first member 304 may be an optical window). In addition, the sensor structure 306 includes an optical window 308 to enable incoming light to impinge upon a light sensing circuit of the sensor structure 306.

The housing 302 defines an inner cavity 310 within which the first member 304 may at least partially lie. A photochromic solution 312 is placed within the cavity 310 between the first member 304 and the sensor structure 306. Thus, light L entering the sensor assembly 300 may be attenuated, at least in part, by the photochromic solution 312. Better attenuation (e.g., precise attenuation of just the area of the high intensity light) may be achieved in this case (e.g., as compared to the liquid photochromic filter 100) since photochromic solution 312 may be very close to the image sensing circuitry (e.g., in some cases, the photochromic solution 312 could be in contact with the image sensing circuitry). Also, in some implementations, it may be desirable to keep the width of the cavity as small as possible (e.g., to keep the attenuation plane as close as possible to the image sensing plane) to improve the accuracy of the attenuation.

In some implementations, the sensor assembly 300 includes a first seal 314 between the first member 304 and the sensor structure 306. In this case, the photochromic solution 312 may be disposed between (e.g., sealed in place by) the first member 304, the sensor structure 306, and the first seal 314. In some implementations, the sensor assembly 300 includes a second seal (not shown) between the first member 304 and the housing 302.

Figure 4:
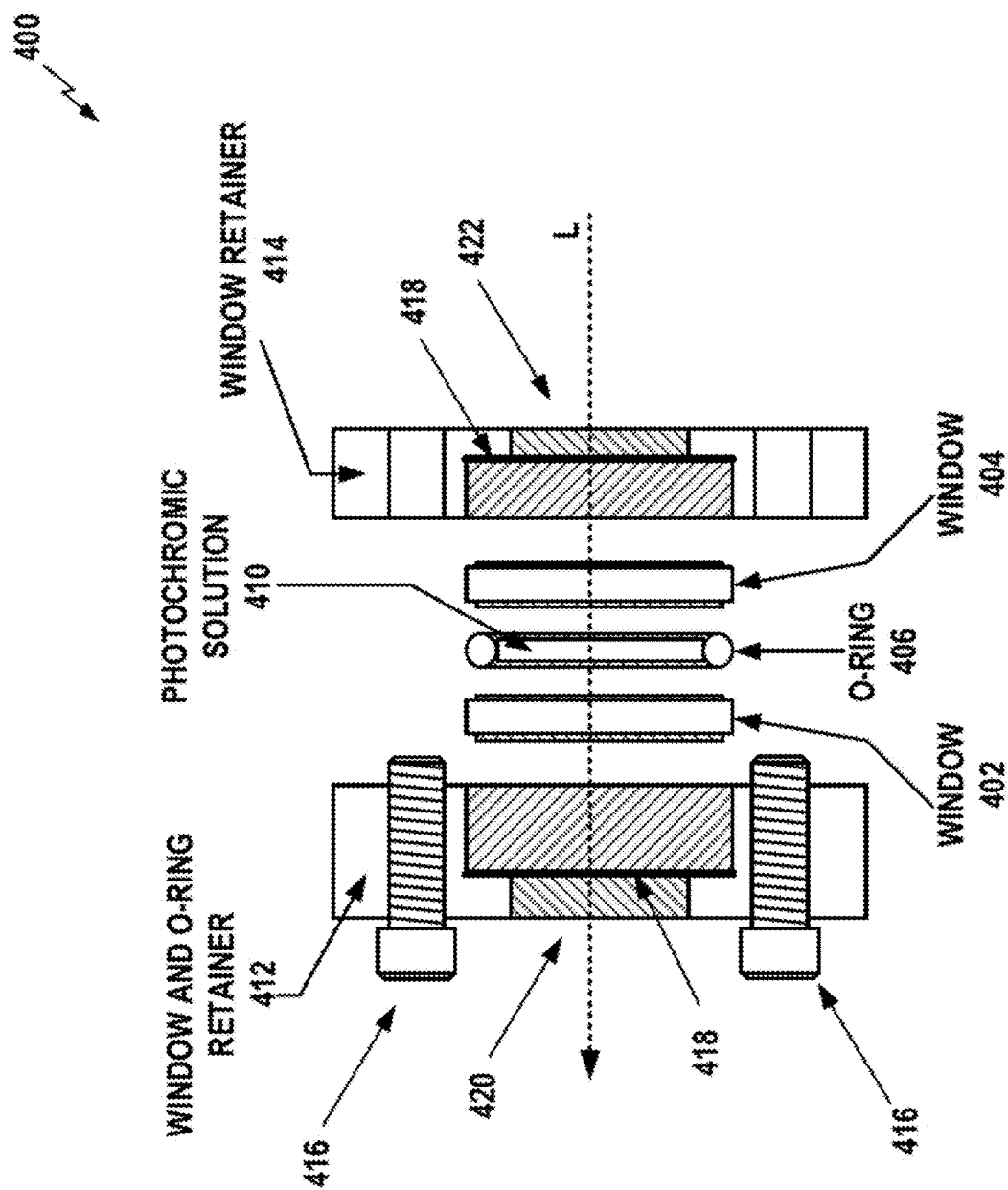
FIG. 4 depicts an exploded side view of a liquid photochromic filter in accordance with the teachings herein.
Figure 5:
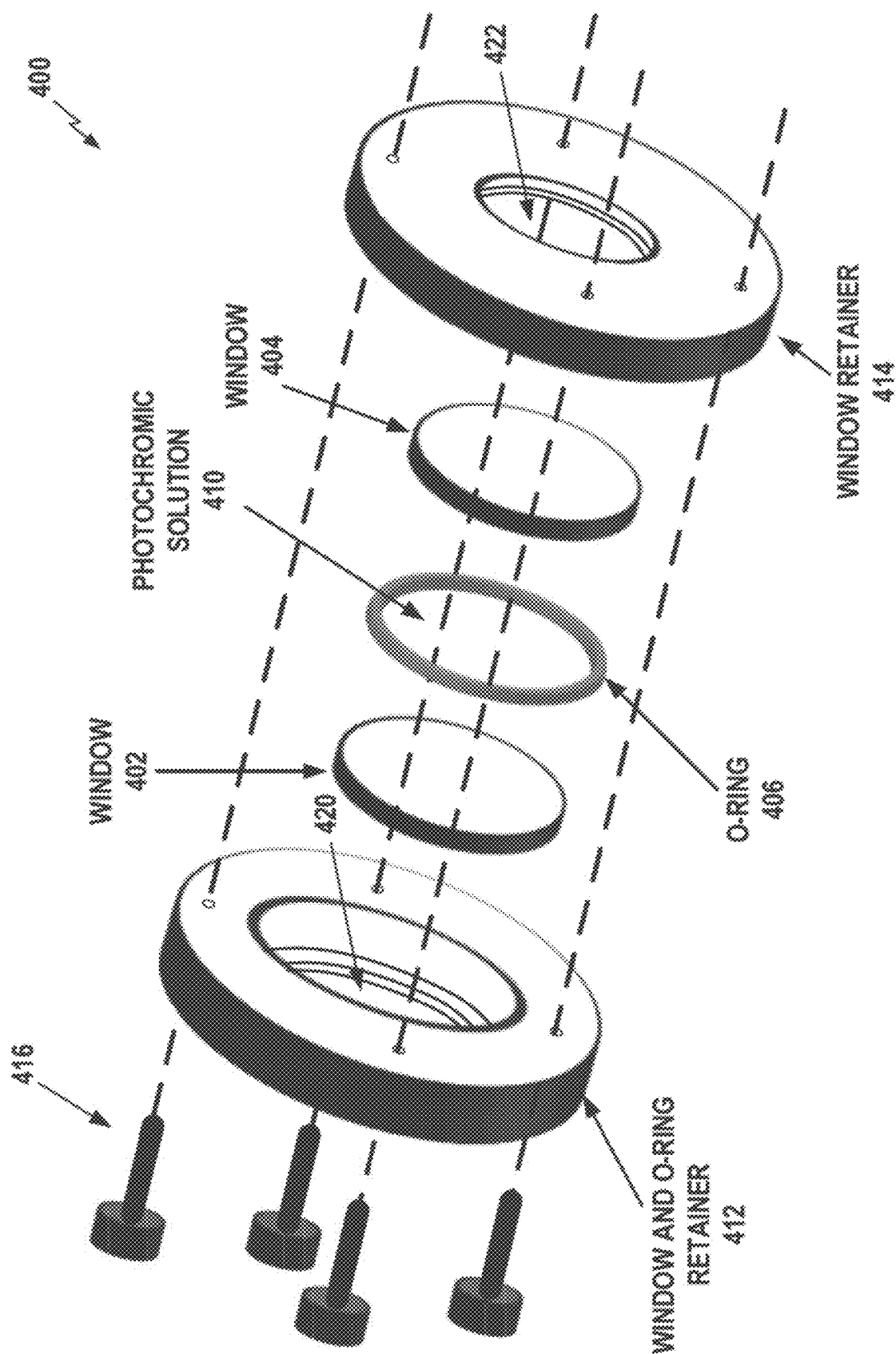
FIG. 5 depicts an exploded perspective view of the liquid photochromic filter of FIG. 4.
Figure 6:
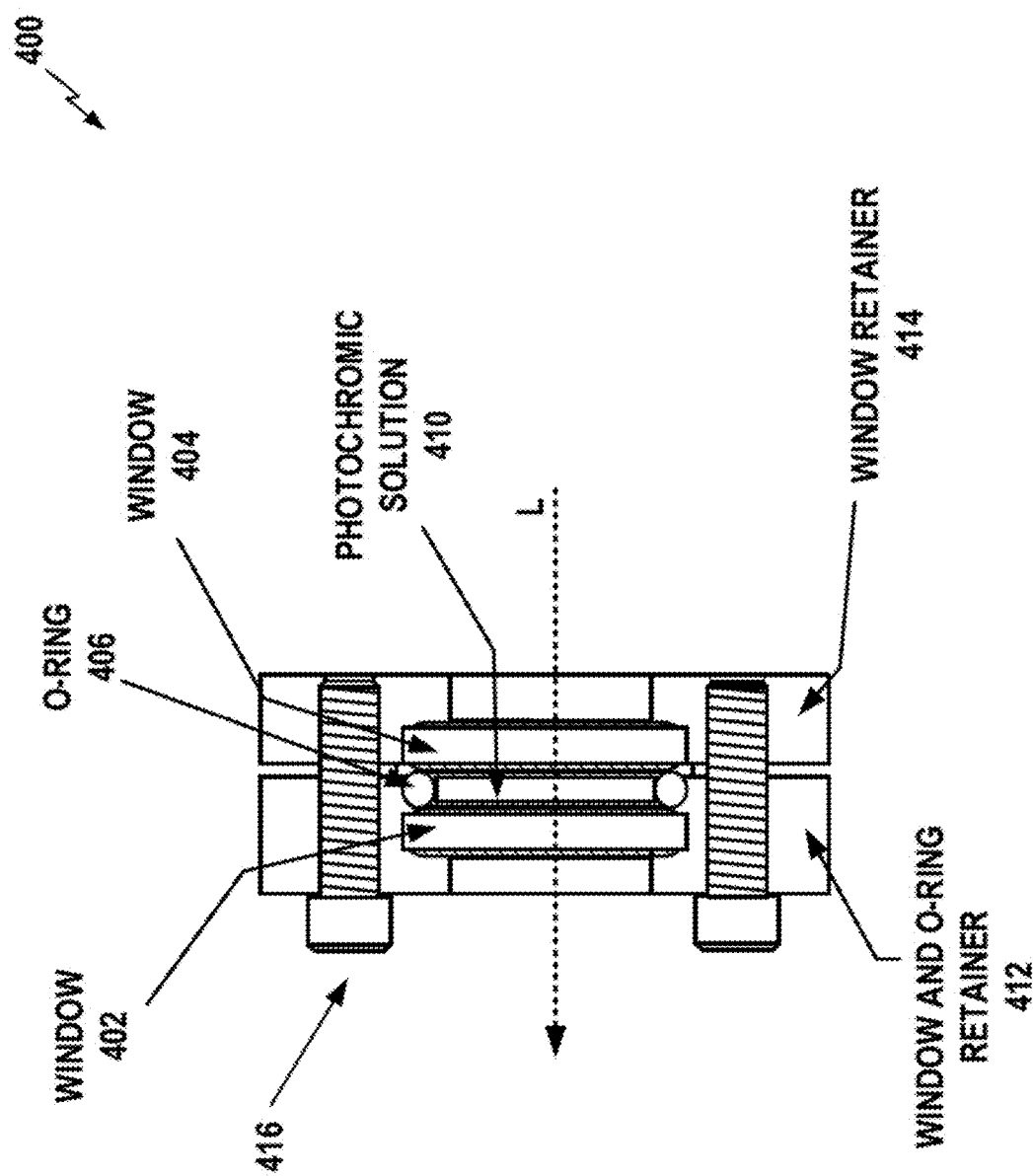
FIG. 6 depicts a side view of the liquid photochromic filter of FIG. 4.

Referring now to FIGS. 4-6, an example of a liquid photochromic filter 400 (e.g., similar to the filter 100) will be described in more detail. FIG. 4 depicts an exploded side view of the liquid photochromic filter 400. FIG. 5 depicts an exploded perspective view of the liquid photochromic filter 400. FIG. 6 depicts a side view of the liquid photochromic filter 400.

The filter 400 includes a first window 402, a second window 404, and an O-ring 406 configured to hold a photochromic solution 410 therebetween. The first window 402, the second window 404, and the O-ring 406 are held in place by a window and O-ring retainer 412 and a window retainer 414. At least one attachment mechanism 416 (e.g., screws, bolts, or some other suitable mechanism) holds the retainers 412 and 414 together. In some implementations, a sealant 418 (e.g., epoxy or some other suitable adhesive and/or sealant) may be used to fix the first window 402 to the window and O-ring retainer 412 and to fix the second window 404 to the window retainer 414.

The retainers 412 and 414 include openings to allow light L to pass through the filter 400. Specifically, the window and O-ring retainer 412 defines an opening 420 and the window retainer 414 defines an opening 422.

Figure 7:
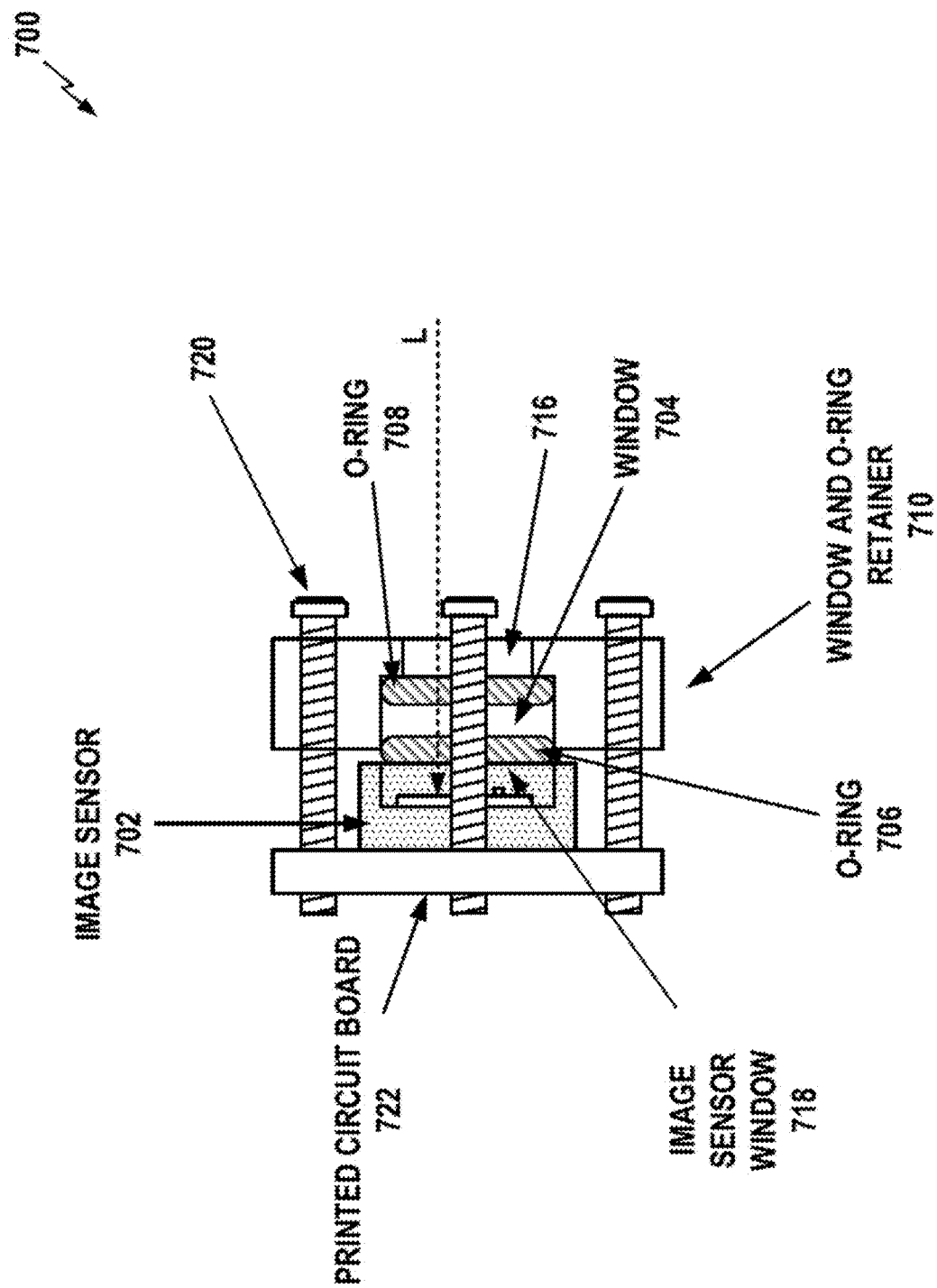
FIG. 7 depicts a side view of a sensor assembly including a liquid photochromic filter in accordance with the teachings herein.
Figure 8:
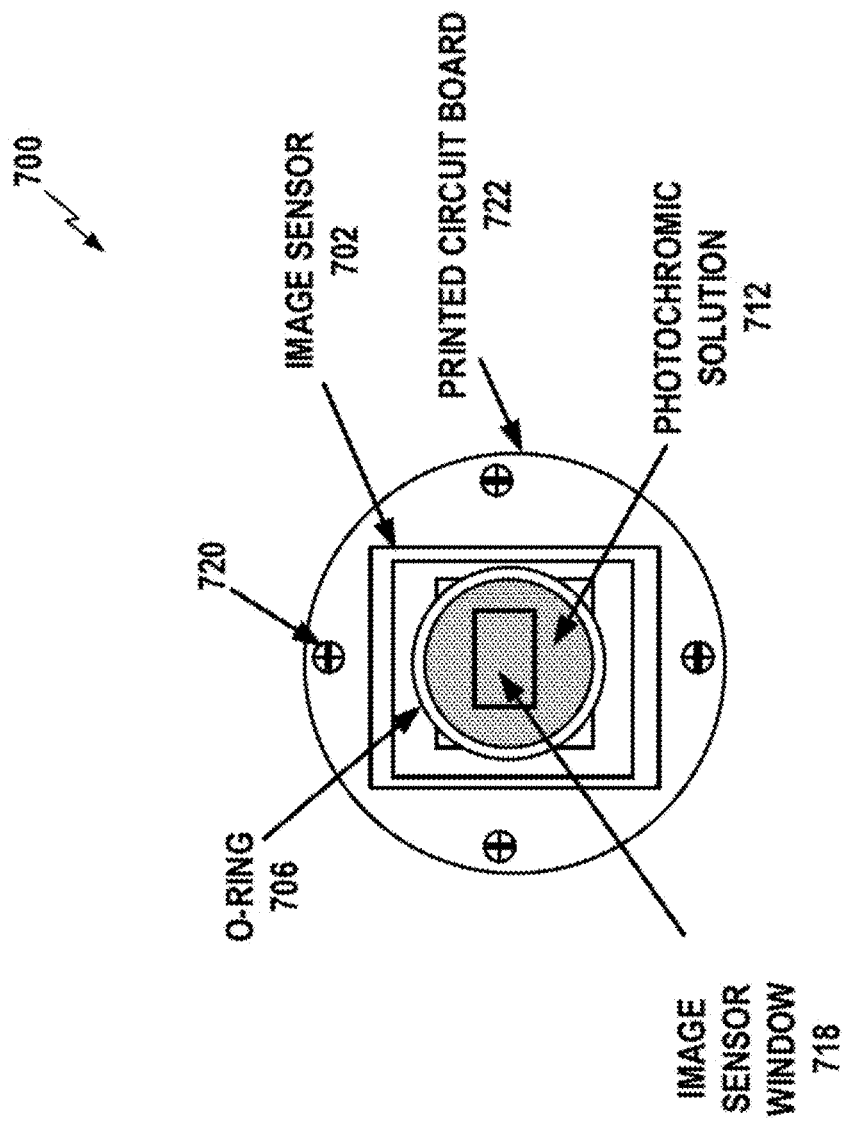
FIG. 8 depicts a front view of the sensor assembly of FIG. 7.
Figure 9:
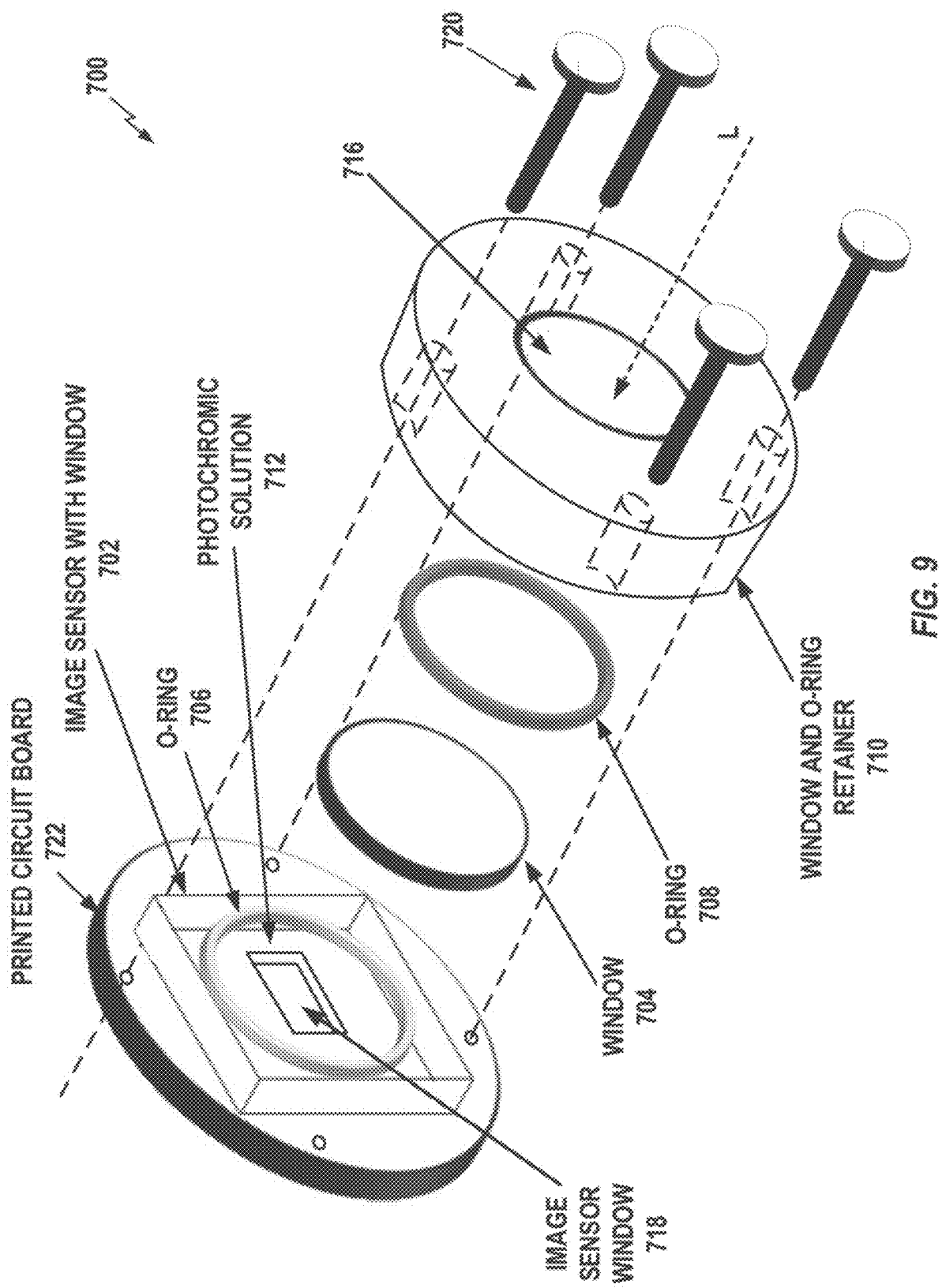
FIG. 9 depicts an exploded perspective view of the sensor assembly of FIG. 7.

Referring now to FIGS. 7-9, an example of a sensor assembly 700 (e.g., similar to the sensor assembly 300) including a liquid photochromic filter will be described in more detail. FIG. 7 depicts a side view of the sensor assembly 700. FIG. 8 depicts a front view of the sensor assembly 700. FIG. 9 depicts an exploded perspective view of the sensor assembly 700.

The sensor assembly 700 includes an image sensor 702, a window 704, a first O-ring 706, a second O-ring 708, and a window and O-ring retainer 710. The O-rings 706 and 708 seal and hold the window 704 in place between the image sensor 702 and the window and O-ring retainer 710. The image sensor 702, the window 704, and the first O-ring 706 hold a photochromic solution 712 therebetween. The window and O-ring retainer 710 defines an opening 716 to allow light L to pass through the sensor assembly 700 (through the window 704) to a window 718 of the image sensor 702.

At least one attachment mechanism 720 (e.g., screws, bolts, or some other suitable mechanism) holds the image sensor 702 and the window and O-ring retainer 710 together. The image sensor 702 is mounted on and electrically connected to a printed circuit board (PCB) 722. The PCB 722 may include, for example, circuitry for receiving signals from and controlling the image sensor 702.

Figure 10:
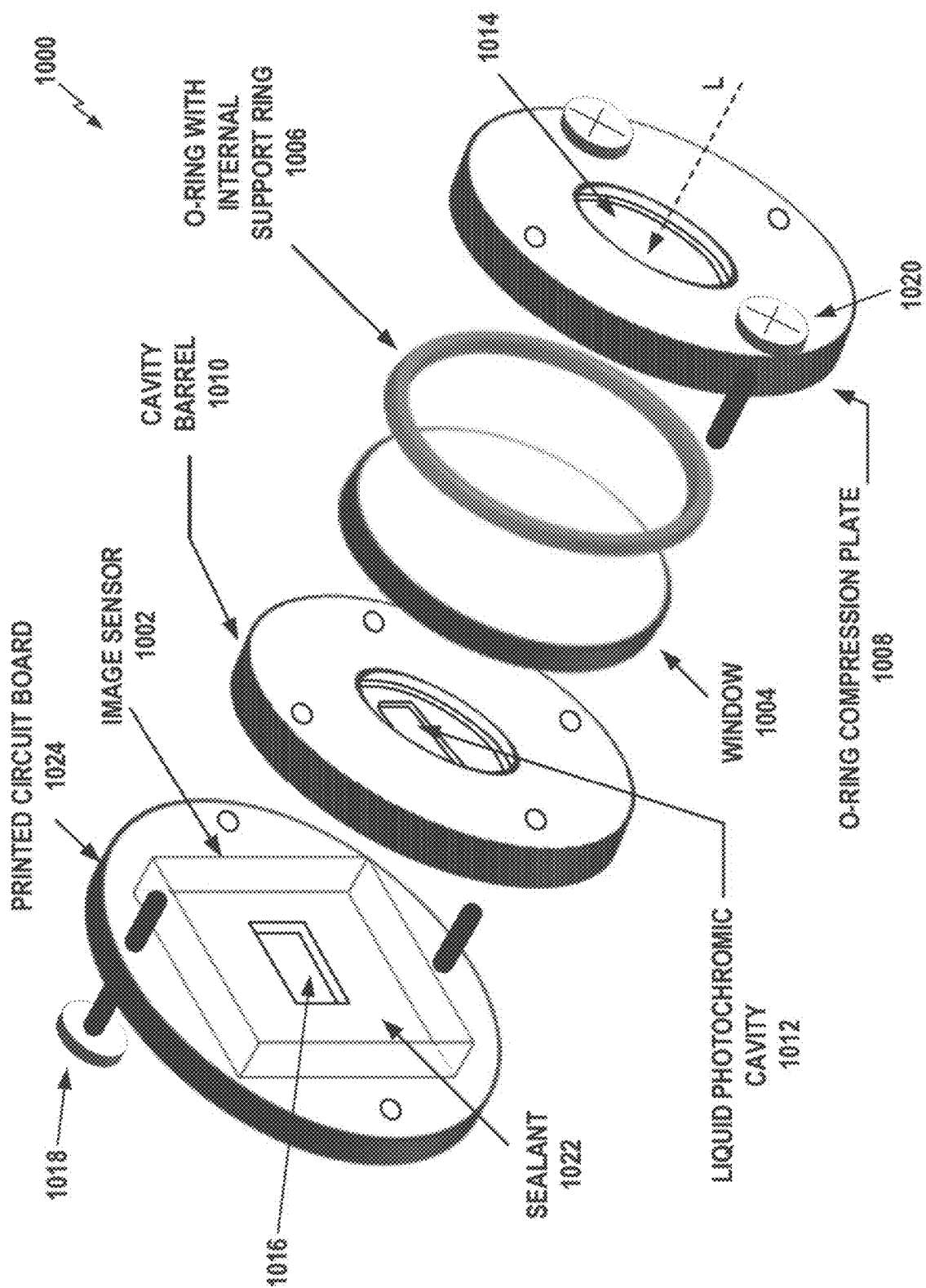
FIG. 10 depicts an exploded perspective view of another sensor assembly including a liquid photochromic filter in accordance with the teachings herein.

Referring now to FIG. 10, another example of a sensor assembly 1000 (e.g., similar to the sensor assembly 300) including a liquid photochromic filter will be described in more detail. FIG. 10 depicts an exploded perspective view of the sensor assembly 1000.

The sensor assembly 1000 includes an image sensor 1002, a window 1004, an O-ring 1006, an O-ring compression plate 1008, and cavity barrel 1010. The image sensor 1002, the window 1004, and the cavity barrel 1010 define a cavity 1012 to hold a photochromic solution therein. The O-ring 1006 holds the window 1004 in place between the cavity barrel 1010 and the O-ring compression plate 1008. The O-ring compression plate 1008 defines an opening 1014 to allow light L to pass through the sensor assembly 1000 (through the window 1004 and the cavity 1012) to a window 1016 of the image sensor 1002.

At least one attachment mechanism 1018 (e.g., screws, bolts, or some other suitable mechanism) holds the image sensor 1002 and the cavity barrel 1010 together. At least one attachment mechanism 1020 (e.g., screws, bolts, or some other suitable mechanism) holds the O-ring compression plate 1008, the O-ring 1006, the window 1004, and the cavity barrel 1010 together. An attachment mechanism could also hold all of the image sensor 1002, the cavity barrel 1010, the O-ring compression plate 1008, the O-ring 1006, and the window 1004 together. In some implementations, a sealant 1022 (e.g., epoxy or some other suitable adhesive and/or sealant) may be used to fix the cavity barrel 1010 to the image sensor 1002. In some implementations, an O-ring (not shown) may be used to provide a seal between the cavity barrel 1010 and the image sensor 1002.

The image sensor 1002 is mounted on and electrically connected to a printed circuit board (PCB) 1024. The PCB 1024 may include, for example, circuitry for receiving signals from and controlling the image sensor 1002.

Figure 11:
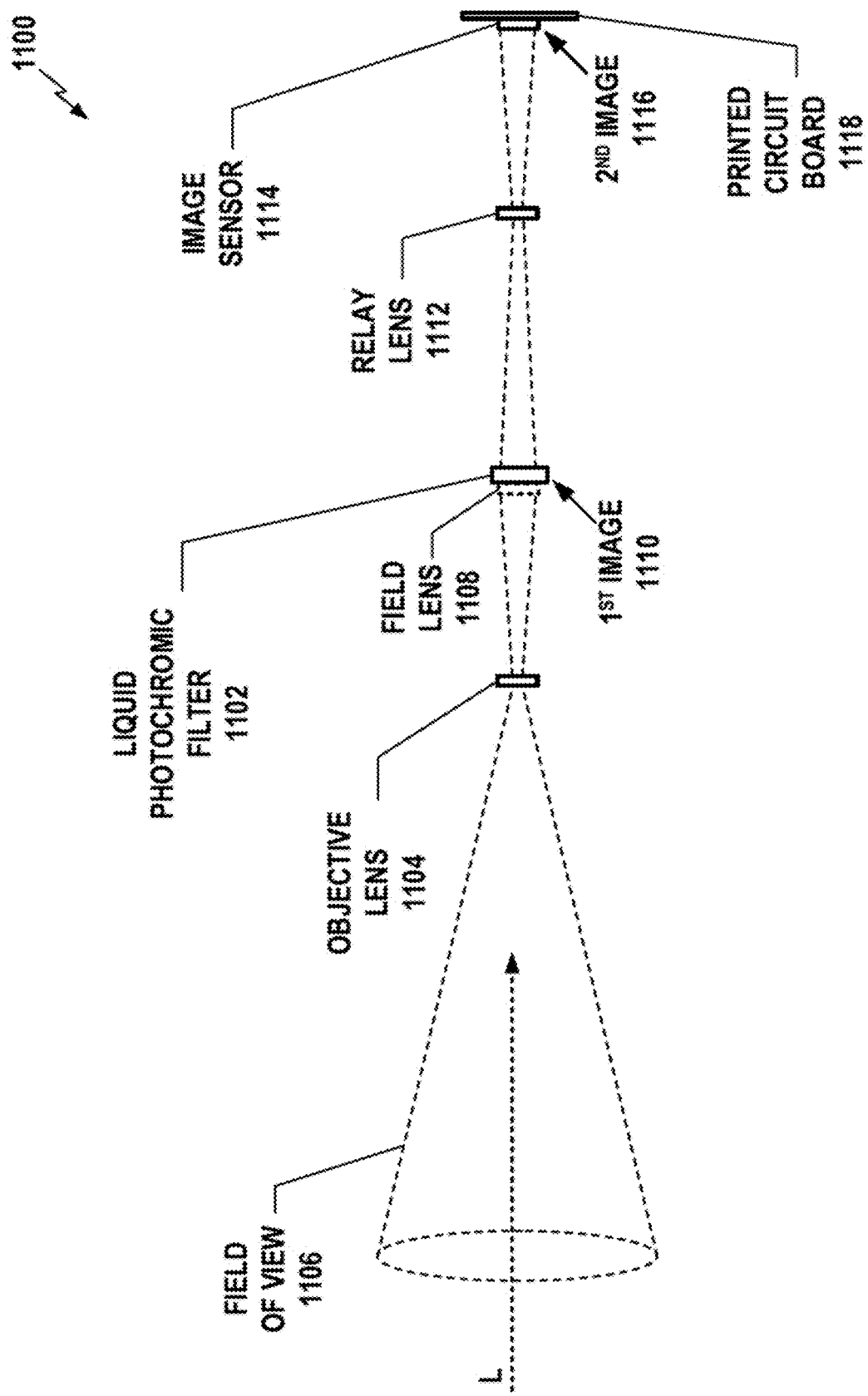
FIG. 11 depicts a side view of an optical relay system including a liquid photochromic filter in accordance with the teachings herein.

FIG. 11 illustrates an example of an optical relay system 1100 (e.g., a camera) that includes a liquid photochromic filter 1102. An advantage of such a relay system is that the first image (e.g., a virtual image) that is projected into the photochromic solution may be on the same plane as the attenuation (e.g., in contrast with a system where a filter provides the attenuation before reaching the image plane of the sensor). Thus, the attenuation can be on the same place as the image sensing. This may provide more effective (e.g., sharper) attenuation as discussed above.

An objective lens assembly 1104 directs light from a field of view 1106 of the optical relay system 1100 to the liquid photochromic filter 1102 (e.g., a liquid photochromic lens filter). The objective lens assembly 1104 may include a filter for blocking infra-red light, an aperture structure for restricting the amount of light that enters the system, and an objective lens. As indicated, the objective lens assembly 1104 focuses light L onto the liquid photochromic filter 1102. In some implementations, the objective lens assembly 1104 may focus the light L onto a field lens 1108 that precedes the liquid photochromic filter 1102. In any event, a first image 1110 corresponding to the field of view 1106 is present at the liquid photochromic filter 1102.

The optical relay system 1100 includes a relay lens 1112 between the liquid photochromic filter 1102 and an image sensor 1114. A second image 1116 corresponding to the field of view 1106 is thus imparted upon the image sensor 1114.

The image sensor 1114 may be connected to (e.g., attached to) a printed circuit board (PCB) 1118. The PCB 1118 includes signal traces (and, optionally, electronic circuitry) that enables signals to be sent between the image sensor 1114 and signal processing components (not shown in FIG. 11) to display images sensed by and control the operation of the optical relay system 1100.

Any of the lenses of the optical relay system 1100 may include a filter to, for example, prevent ultraviolet light or other undesirable light wavelengths (e.g., projected from a light source) from impinging upon the image sensor 1114. As one non-limiting example, such a filter may be constructed to block (e.g., absorb and/or reflect) light having wavelengths in the range of 250 nm to 420 nm. As another non-limiting example, such a filter may be constructed to block (e.g., absorb and/or reflect) light having wavelengths in the range of 350 nm to 650 nm.

Figure 12:
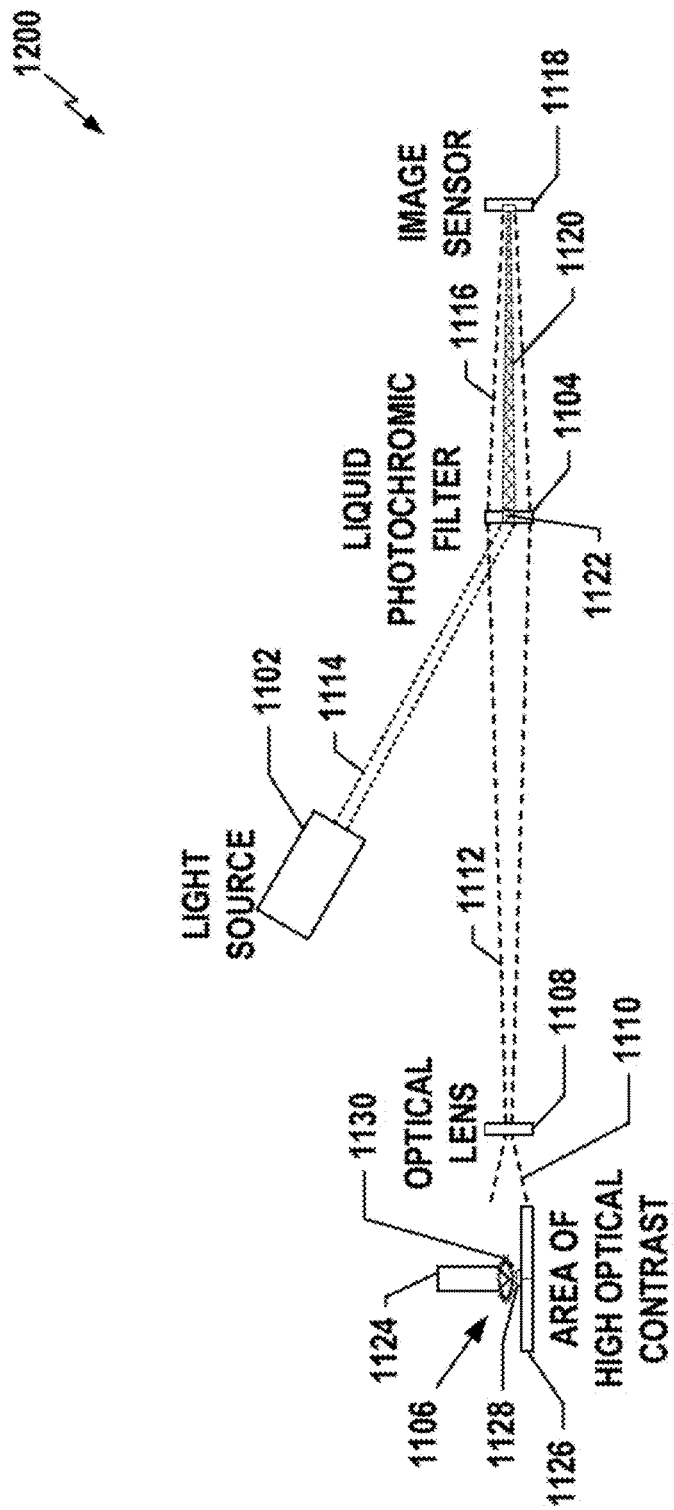
FIG. 12 is a block diagram illustrating an example of an imaging system in accordance with the teachings herein.

FIG. 12 illustrates an imaging system 1200 (e.g., a camera system) that includes a light source 1202 for activating a liquid photochromic filter 1204 (e.g., a liquid photochromic lens filter) to filter out bright light from an area of high optical contrast 1206. An optical lens 1208 collects light 1210 from the area of high optical contrast 1206 and projects output light 1212 onto the liquid photochromic filter 1204. The light source 1202 projects light 1214 onto an area of the liquid photochromic filter 1204. The liquid photochromic filter 1204 will thus attenuate some of the light 1216 that is passed to an image sensor 1218. The image detected by the image sensor 1218 may then be displayed on a display device (not shown in FIG. 12).

By proper alignment of the optical lens 1208 and the light source 1202 with the area of high optical contrast 1206 and the liquid photochromic filter 1204, particularly bright light emanating from the area of high optical contrast 1206 can be attenuated by the liquid photochromic filter 1204. Thus, the portion 1220 of the light 1216 that passed through the activated portion 1222 of the liquid photochromic filter 1204 will be attenuated. Consequently, large differences in optical contrast that are present in the light 1210 from the area of high optical contrast 1206 are reduced in the light 1216 that ultimately reaches the image sensor 1218.

For purposes of explanation, the relative sizes and placement shown for the components of FIG. 12 do not necessarily represent the sizes and placement that may be used in an actual implementation. For example, the liquid photochromic filter 1204 may be much closer to the image sensor 1218. As another example, the optical lens 1208 may be further away from the area of high optical contrast 1206.

In a typical implementation, an area of optical contrast to be monitored by the imaging system 1200 (e.g., the area of high optical contrast 1206) corresponds to a welding area. For example, a welding electrode 1224 may be used to weld together two workpieces 1226, in the process creating a weld puddle 1228 at the junction of the workpieces 1226. The welding process generates an arc 1230 of very high intensity, resulting in dramatic contrasts between the area of the arc 1230 and the surrounding areas which would appear much darker. If a conventional image sensor is used to monitor these areas, the high intensity arc 1230 tends to "wash out" bright portions of the sensed image, with the darker areas surrounding the arc 1230 represented as being darkened to the point of obscurity.

This creates a problem because it is desirable for an operator to be able to view the welding process. For example, an operator would typically observe the position of the electrode 1224 relative to the workpieces 1226 along with the characteristics of the weld puddle 1228 to ensure that the weld is produced uniformly and without flaws.

An imaging system constructed in accordance with the teachings herein can be used to address this problem in remote welding applications. The imaging system 1200 is also effective for low amperage welding applications since the light source 1202 controls the opacity of the liquid photochromic filter 1204. That is, the opacity of the liquid photochromic filter 1204 is not entirely dependent on the light from the welding arc 1230.

The imaging system 1200 can be configured to dynamically filter and reduce the steep intensity gradient areas to improve the monitoring of a welding process. Here, the liquid photochromic filter 1204 may serve as variable optical density filter to reduce the intensity of the desired areas and maintain the contrast in the remaining field of view. As one non-limiting example, the liquid photochromic filter 1204 may be constructed to block (e.g., absorb and/or reflect) light having wavelengths in the range of 350 nanometers to 650 nanometers if the liquid photochromic filter 1204 is subjected to the activating light.

During the non-welding inspection process, the liquid photochromic filter 1204 can be deactivated (e.g., by turning off the light source 1202) to diminish the filtering and provide a clear field of view. The liquid photochromic filter 1204 can be then be activated (e.g., by turning on the light source 1202) before the plasma of the welding arc is present to create a smooth transition from non-welding to welding.

The light source 1202 may include a light emitting diode (LED), a laser, or some other type of light source that emits electromagnetic radiation with the proper wavelengths and intensity for photochromic activation (e.g., violet light or ultraviolet light). As one non-limiting example, the light source 1202 may generate light having wavelengths in the range of 350 nanometers (nm) to 420 nm. As another non-limiting example, the light source 1202 may generate light having wavelengths in the range of 350 nm to 500 nm.

The intensity of the light output by light source 1202 can be adjusted dynamically to alter the optical density of the light absorbing area(s) of the liquid photochromic filter 1204. For example, by increasing the intensity of the activating light, there may be a reduction in the high intensity areas of the welding process as detected by the image sensor 1218. As one non-limiting example, the light source 1202 may generate light having an intensity of 10 to 20 milliwatts (mW).

In some implementations, the liquid photochromic filter 1204 is positioned at an image plane in an optical relay system of the imaging system 1200. For example, relay lenses (not shown in FIG. 12) may be incorporated between the liquid photochromic filter 1204 and the image sensor 1218.

The light source 1202 may include a short wave pass filter for passing a specified range of light having relatively shorter wavelengths (e.g., less than 420 nm) and a long wave blocking filter for blocking a specified range of light having relatively longer wavelengths (e.g., greater than 420 nm). The light source 1202 also includes a lens for focusing the light generated by the light source onto the area or interest (activated area) of the photochromic filter.

Figure 13:
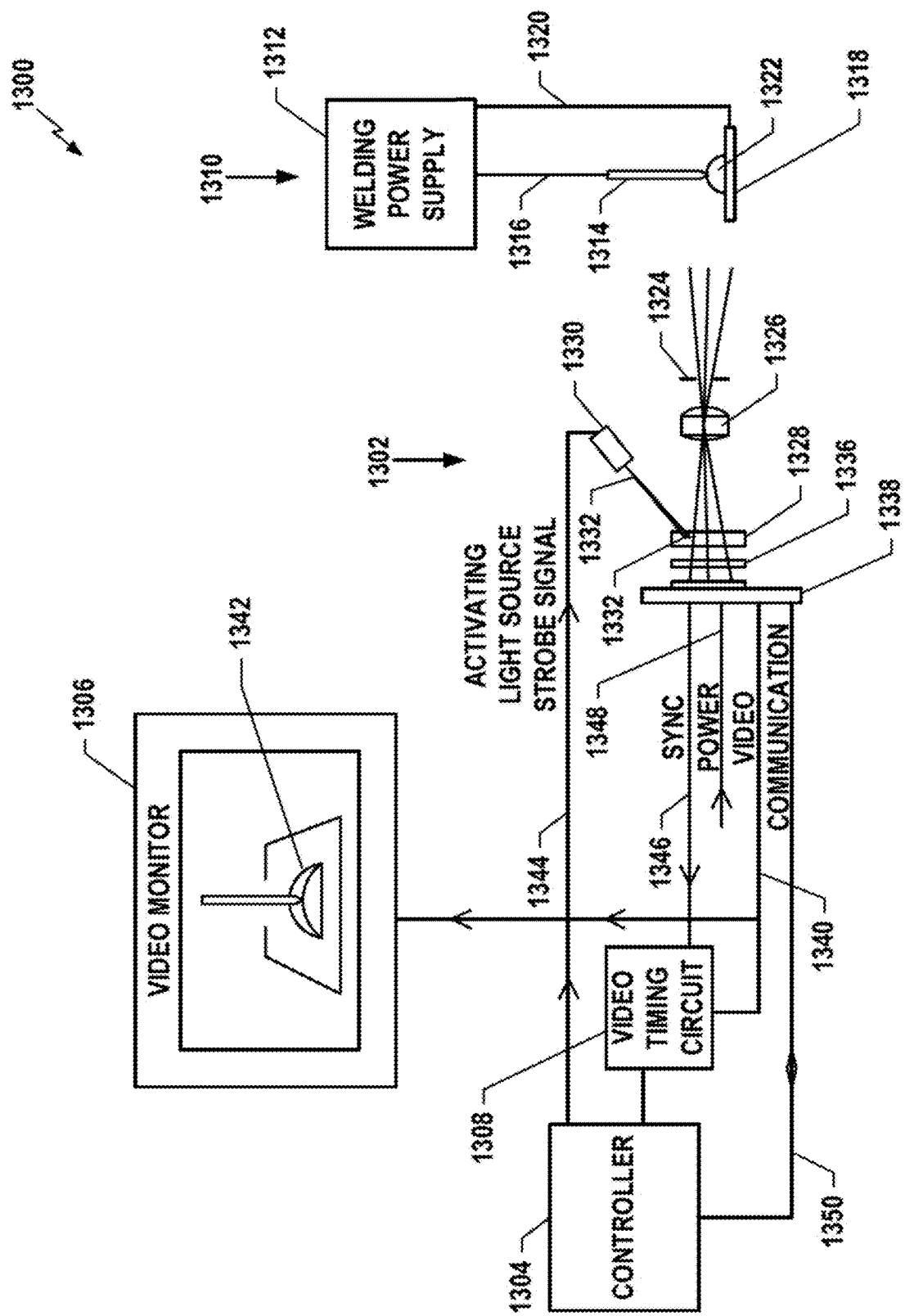
FIG. 13 is a block diagram illustrating an example of a welding system in accordance with the teachings herein.

FIG. 13 illustrates several examples of circuitry that may be incorporated into a welding system 1300 as taught herein. The welding system 1300 includes optical components 1302, a controller 1304 (e.g., a micro controller), a video monitor 1306, and an optional video timing circuit 1308.

The welding system 1300 monitors a welding operation performed by a welding device 1310 as discussed herein. The welding device 1310 include a power supply 1312 that is electrically coupled to a welding electrode 1314 via an electrode cable 1316 and to a weldment 1318 via a ground cable 1320. During the welding operation, the welding device 1310 generates an arc 1322, resulting in an area of high optical contrast.

The optical components 1302 include an aperture structure 1324 for restricting the amount of light that enters the optical components 1302 of the welding system 1300 as discussed herein, and an optical lens (e.g., an objective lens) 1326 for focusing light from the welding area to a liquid photochromic filter 1328. A photochromic activating light source 1330 generates light 1332 that increases the optical density of a portion 1334 of the liquid photochromic filter 1328. A blocking filter 1336 prevents activating light that may pass through the liquid photochromic filter 1328 from reaching an image sensor 1338.

Video signals 1340 generated by the image sensor 1338 are sent to the video monitor 1306. The video monitor 1306 then displays a representation of the welding area based on the video signals 1340. In particular, the displayed image includes an attenuated representation 1342 of the area of high intensity light due to the arc 1322, thereby enabling more effective viewing of the area surrounding the arc 1322.

As mentioned above, the light source 1330 may be controlled to improve the imaging capabilities of the welding system 1300. To this end, the controller 1304 may generate a strobe signal 1344 that controls when the activating light source 1330 is enabled or disabled. Alternatively, or in addition, the video timing circuit 1308 may receive synchronization signals 1346 (sync) and the video signals 1340 from the image sensor 1338. Based on these signals, the video timing circuit 1308 may cooperate with the controller 1304 to control when the light source 1330 is enabled or disabled. For example, the controller 1304 may synchronize activation of the light source 1330 with activation of the image sensor 1338. As a more specific example, the controller 1304 may deactivate the light source 1330 a defined period of time prior to activation of the image sensor 1338. Thus, the light source 1330 is turned off when the image sensor 1338 is sensing to prevent light from the light source 1330 from adversely affecting the sensing operation of the image sensor 1338. Here, it should be appreciated that the liquid photochromic filter 1328 may remain activated for a period of time (e.g., several seconds) after the light source 1330 is turned off. Thus, the light detected by the image sensor 1338 may still be attenuated (as discussed above) for a period of time when the light source 1330 is off.

FIG. 13 also illustrates other signals that may be provided to or by the image sensor 1338. For example, power 1348 may be selectively supplied to the image sensor 1338 (e.g., under the control of the controller 1304).

In addition, the controller 1304 and the image sensor 1338 may exchange communication signals 1350 to control the operation of the image sensor 1338. For example, the controller 1304 may be configured to receive a signal (e.g., from an input device used by an operator) corresponding to a desired opacity of the liquid photochromic filter 1328, and then control the intensity of the light 1332 projected by the light source 1330 (e.g., by controlling the strobe signal 1344 or some other suitable signal sent to the light source 1330) based on the received signal. In some implementations, the desired opacity (e.g., in the center of the photochromic filter) is up to 80%. In some implementations, the controller 1304 may be configured to specify a duty cycle for the light 1332 projected by the light source 1330 to control the intensity of this light.

Other Aspects

In some aspects the disclosure relates to a photochromic filter, including: a first transparent member; a housing attached to the first transparent member, thereby defining a chamber adjacent the first transparent member; and a photochromic solution in the chamber.

In some aspects, the photochromic solution may include a photochromic dye. In some aspects, the photochromic solution may include a photochromic dye mixed with a solvent. In some aspects, the photochromic solution may be activatable by light having wavelengths in a range of 350 nanometers to 450 nanometers. In some aspects, the photochromic solution may be activatable to block light having wavelengths in a range of 350 nanometers to 650 nanometers.

In some aspects, the first transparent member may include (e.g., may be) an optical window. For example, the first transparent member may correspond to any of the windows shown in FIGS. 1 and 3-10.

In some aspects, the housing may include (e.g., may be) any suitable structure for holding the first transparent member, and optionally other components. For example, the housing may correspond to any of the housings shown in FIGS. 1 and 3, any of the retainers shown in FIGS. 4-9, an O-ring compression plate as shown in FIG. 10, or a cavity barrel as shown in FIG. 10.

In some aspects, the housing may include a first housing member and a second housing member. For example, the first housing member and the second housing member may correspond to the window retainer and the window and O-ring retainer, respectively, of FIGS. 4-6. As another example, the first housing member and the second housing member may correspond to the O-ring compression plate and the cavity barrel, respectively, of FIG. 10.

In some implementations, the photochromic filter may further include a second transparent member. In some aspects, the second transparent member may include (e.g., may be) an optical window. For example, the second transparent member may correspond to a window as shown in FIGS. 1 and 3-6. As another example, the second transparent member may correspond to an image sensor window as shown in FIGS. 7-10.

In some implementations, the photochromic filter may further include a seal between the first transparent member and the second transparent member. In this case, the seal may further define the chamber such that the photochromic solution is between the seal, the first transparent member, and the second transparent member. In some cases, the seal may include (e.g., may be) an O-ring or some other suitable sealing structure.

In some implementations, a first housing member is attached to the first transparent member, and a second housing member is attached to the second transparent member. In this case, the photochromic filter may further include at least one attachment mechanism to attach the first housing member to the second housing member. In addition, the photochromic filter may include a first seal to attach the first housing member to the first transparent member, and a second seal to attach the second housing member to the second transparent member. In some aspects, the first seal and the second seal may include (e.g., may be) epoxy or some other suitable sealant and/or adhesive.

In some implementations, the photochromic filter may further include a sensor structure. In some aspects, the sensor structure may include an image sensor circuit. For example, the sensor structure may correspond to the sensor structure shown in FIG. 3, or any of the image sensors shown in FIGS. 7-10. In some aspects, the sensor structure may include a printed circuit board (e.g., as shown in FIGS. 7-10).

In some implementations, the sensor structure may include an optical window. For example, the sensor structure may include an optical window as shown in FIG. 3, or any of the optical windows shown in FIGS. 7-10.

In some implementations, the sensor structure might not include an optical window. In this case, the photochromic solution may come in direct contact with image sensor circuitry (e.g., in a scenario where a sensor assembly of any of FIGS. 7-10 does not include an optical window structure).

In some implementations, the photochromic filter may further include a first seal between the sensor structure and the first transparent member, and a second seal between the housing and the first transparent member. In this case, the first seal may further define the chamber such that the photochromic solution is between the first seal, the sensor structure, and the first transparent member. Here, the first seal and the second seal may include (e.g., may be) O-rings or some other suitable sealing structure.

In some implementations, the photochromic filter may further include a first seal to attach the housing to the first transparent member. The seal may include (e.g., may be) epoxy or some other suitable adhesive and/or sealant.

In some implementations where the housing includes a first housing member and a second housing member, the first housing member may be attached to the first transparent member, and the second housing member may be attached to the sensor structure and the first transparent member. In this case, the second housing member may further define the chamber such that the photochromic solution is between the second housing member, the sensor structure, and the first transparent member.

In some implementations, the photochromic filter may further include a first seal between the sensor structure and the second housing member, and a second seal between the first transparent member and the first housing member. Here, the first seal may include (e.g., may be) epoxy and the second seal may include (e.g., may be) an O-ring.

In some implementations, the photochromic filter may further include at least one attachment mechanism. For example, at least one attachment mechanism may be used to attach the first housing member to the second housing member (e.g., with or without other components between the housing members). As example, at least one attachment mechanism may be used to attach the housing to the sensor structure (e.g., with or without other components between the housing and the sensor structure). In some aspects, the at least one attachment mechanism may include (e.g., may be) a screw, a bolt, a clip, an adhesive, or some other mechanism or material suitable for attaching one component to another.

As used herein, the term attach refers to a mechanical coupling between two or more components. The coupling may be direct or indirect. For example, a direct coupling may involve two components being directly in contact with each other. As another example, an indirect coupling may involve one or more components (e.g., an O-ring, a window, or some other component) between two components that are coupled. Thus, in an indirect coupling, the coupled components might not be in direct contact with each other.

An attachment may be permanent or non-permanent. As an example of the latter case, a component may be removably attached to another component. That is, the component can be subsequently de-attached from one another. Thus, an attachment mechanism may provide a removable attachment in some cases. For example, first and second housing members may come apart (e.g., by unscrewing screws that hold the members together) to enable the photochromic solution to be replaced. As another example, a window and O-ring retainer may be detachable from an image sensor to enable the photochromic solution to be replaced. As yet another example, a cavity barrel may be detachable from an image sensor to enable the photochromic solution to be replaced. Also, an O-ring compression plate may be detachable from a cavity barrel to enable the photochromic solution to be replaced. Alternatively, in cases where a cavity barrel is part of a sensor structure, an O-ring compression plate may be detachable from the sensor structure to enable the photochromic solution to be replaced.

In some aspects the disclosure relates to an imaging system for sensing light in an area of high optical contrast (e.g., the imaging system of FIG. 12). The imaging system may include, for example: a liquid photochromic filter; at least one optical lens oriented to direct light from an area of high optical contrast to the liquid photochromic filter; and an image sensor oriented to receive the light after the light passes through the liquid photochromic filter.

In some aspects the disclosure relates to a welding system (e.g. the welding system of FIG. 13). The welding system may include, for example, a welding device including a power supply electrically coupled to a welding electrode; a liquid photochromic filter; at least one optical lens oriented to direct light to the liquid photochromic filter from an area in the vicinity of the welding electrode; and an image sensor oriented to receive the light after the light passes through the liquid photochromic filter.

Additional Aspects

The teachings herein may be implemented in a variety of ways. For example, the structure and functionality taught herein may be incorporated into various types of imaging systems (e.g., of various configurations) and into other types of apparatuses. As another example, an apparatus as taught herein may be constructed using a variety of components and materials.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

Moreover, any reference to elements herein using a designation such as "first," "second," and so forth does not generally limit the quantity or order of those elements. Rather, these designations may be used herein as a convenient method of distinguishing between two or more different elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements." For example, this terminology may include A, or B, or C, or A and B, or A and C, or A and B and C, or 2A, or 2B, or 2C, and so on.

While certain embodiments have been described above in detail and shown in the accompanying drawings, it is to be understood that such embodiments are merely illustrative of and not restrictive of the teachings herein. In particular, it should be recognized that the teachings herein apply to a wide variety of apparatuses and methods. It will thus be recognized that various modifications may be made to the illustrated embodiments or other embodiments, without departing from the broad scope thereof. In view of the above, it will be understood that the teachings herein are intended to cover any changes, adaptations or modifications which are within the scope of the disclosure.

What is claimed is:

1. A photochromic filter, comprising:
   a first transparent member;
   a housing attached to the first transparent member, thereby defining a chamber adjacent the first transparent member;
   a photochromic solution in the chamber;
   a second transparent member; and
   a seal between the first transparent member and the second transparent member,
   wherein the seal comprises an O-ring and wherein the seal further defines the chamber such that the photochromic solution is between the seal, the first transparent member, and the second transparent member.

2. The photochromic filter of claim 1, wherein the photochromic solution comprises a photochromic dye mixed with a solvent.

3. The photochromic filter of claim 1, wherein the photochromic solution is activatable by light having wavelengths in a range of 350 nanometers to 450 nanometers.

4. The photochromic filter of claim 1, wherein the photochromic solution is activatable to block light having wavelengths in a range of 350 nanometers to 650 nanometers.

5. The photochromic filter of claim 1, wherein the first transparent member comprises an optical window.

6. The photochromic filter of claim 1, further comprising a sensor structure.

7. A photochromic filter, comprising:
   a first transparent member;
   a housing attached to the first transparent member, thereby defining a chamber adjacent the first transparent member;
   a photochromic solution in the chamber; and
   a second transparent member, wherein:
      the housing comprises a first housing member and a second housing member;
      the first housing member is attached to the first transparent member; and
      the second housing member is attached to the second transparent member.

8. The photochromic filter of claim 7, further comprising:
   at least one attachment mechanism to attach the first housing member to the second housing member.

9. The photochromic filter of claim 7, further comprising:
   a first seal to attach the first housing member to the first transparent member; and
   a second seal to attach the second housing member to the second transparent member.

10. The photochromic filter of claim 9, wherein the first seal and the second seal comprise epoxy.

11. The photochromic filter of claim 7, further comprising a sensor structure.

12. A photochromic filter, comprising:
   a first transparent member;
   a housing attached to the first transparent member, thereby defining a chamber adjacent the first transparent member;
   a photochromic solution in the chamber; and
   a sensor structure comprising an optical window.

13. The photochromic filter of claim 12, further comprising:
   at least one attachment mechanism to attach the sensor structure to the housing.

14. The photochromic filter of claim 12, further comprising:
   a first seal between the sensor structure and the first transparent member; and
   a second seal between the housing and the first transparent member,
   wherein the first seal further defines the chamber such that the photochromic solution is between the first seal, the sensor structure, and the first transparent member.

15. The photochromic filter of claim 14, wherein the first seal and the second seal comprises O-rings.

16. The photochromic filter of claim 12, further comprising:
   a first seal to attach the housing to the first transparent member.

17. The photochromic filter of claim 16, wherein the first seal comprises epoxy.

18. The photochromic filter of claim 12, wherein:
   the housing comprises a first housing member and a second housing member;
   the first housing member is attached to the first transparent member; and the second housing member is attached to the sensor structure and the first transparent member, and further defines the chamber such that the photochromic solution is between the second housing member, the sensor structure, and the first transparent member.

19. The photochromic filter of claim 18, further comprising:
   a first seal between the sensor structure and the second housing member; and
   a second seal between the first transparent member and the first housing member.

20. The photochromic filter of claim 19, wherein:
   the first seal comprises epoxy; and
   the second seal comprises an O-ring.

* * * * *